United States Patent [19]
Na

[11] Patent Number: 6,112,069
[45] Date of Patent: Aug. 29, 2000

[54] RADIO RECEIVER AND METHOD FOR SUPPRESSING ATTENUATION PROPERTIES OF A LOW FREQUENCY SIGNAL

[75] Inventor: Bo-Gyu Na, Kyonggi-do, Rep. of Korea

[73] Assignee: Samsung Electronics Co., Ltd., Rep. of Korea

[21] Appl. No.: 09/007,785

[22] Filed: Jan. 15, 1998

[30] Foreign Application Priority Data

Jan. 15, 1997 [KR]  Rep. of Korea .......................... 97/1033

[51] Int. Cl.[7] ........................................... H04B 1/10
[52] U.S. Cl. .......................... 455/296; 455/75; 455/207; 455/314; 455/316; 455/317
[58] Field of Search .................... 455/73, 75, 119, 455/255–256, 76, 84, 207, 205, 296, 312–316, 317–318; 331/34, 46, 182

[56] References Cited

U.S. PATENT DOCUMENTS

| | | | |
|---|---|---|---|
| 4,718,113 | 1/1988 | Rother et al. ........................... | 455/209 |
| 4,736,390 | 4/1988 | Ward et al. . | |
| 5,111,162 | 5/1992 | Hietala et al. ........................... | 455/76 |
| 5,428,836 | 6/1995 | Sanecki et al. ......................... | 455/315 |
| 5,584,066 | 12/1996 | Okanobu .................................. | 455/302 |
| 5,649,296 | 7/1997 | MacLellan et al. ..................... | 455/73 |

*Primary Examiner*—Doris H. To
*Attorney, Agent, or Firm*—Dilworth & Barrese

[57] ABSTRACT

A radio receiver, and a method therefore, for efficiently suppressing attenuation properties of a low frequency signal, in an analog frequency modulation type radio communication system. The radio receiver includes a first down-converter for mixing a modulated, high-frequency signal received by the radio receiver and a predetermined local oscillating signal to generate an intermediate frequency signal. A modulator modulates the predetermined local oscillating signal by an aural signal transmitted from the transmitter and generates a mixing signal for down-mixing the electrical signal representative of modulated, high-frequency signal. The mixed signal is then applied to the first down-converter. A second down-converter down-converts, in frequency, the intermediate frequency signal generated from the first down-converter into a baseband signal to generate the down-converted signal. A demodulator demodulates the down-converted baseband signal to a demodulated signal representative of the modulated, high-frequency signal received by the radio receiver.

5 Claims, 8 Drawing Sheets

(PRIOR ART)

RADIO RECEIVER AND METHOD FOR SUPPRESSING ATTENUATION PROPERTIES OF A LOW FREQUENCY SIGNAL

BACKGROUND OF THE INVENTION

1. Field of the Invention

The present invention relates to radio communication systems, and more particularly to a radio receiver, and a method therefore, for efficiently suppressing attenuation properties of a low frequency signal.

2. Description of the Related Art

Generally, in an analog frequency modulation type radio communication systems such as, for example, an analog cellular phone or an analog radio telephone, the typical frequency demodulation mode used in a radio receiver is a heterodyne mode employing a frequency discriminator. A heterodyne receiver is a receiver which heterodynes mixes a received high frequency signal with a local oscillator signal in the receiver and obtains an output signal having the frequency of the difference and the sum between frequencies of both signals to perform amplification and detection of the output signal.

FIG. 1 is a block diagram showing the construction of a typical heterodyne receiver.

Referring to FIG. 1, a radio frequency, electromagnetic signal, i.e., a high frequency signal having a spectrum of a double side band is received by antenna 101 which converts the high frequency signal into an electrical signal which is supplied to radio frequency filter 103. Radio frequency filter 103 is a wide band filter which generates a filtered signal. The filtered signal is comprised of signal portions of the electrical signal applied thereto which have frequencies within the passband of radio frequency filter 103. The filtered signal generated from radio frequency filter 103 is applied to first down-mixer 105. Mixer 105 also receives an oscillating signal generated by first local oscillator 152. First down-mixer 105 mixes the filtered signal and the local oscillator signal to generate a down-mixed signal, i.e., the first intermediate frequency signal(or "1st IF") which is applied to bandpass filter 107. Bandpass filter 107 generates a filtered signal which is applied to preamplifier 109 which amplifies the filtered signal. The amplified signal from preamplifier 109 is applied to second down-mixer 160. Mixer 160 also receives an oscillating signal generated by second local oscillator 146. Second down-mixer 160 mixes the amplified signal and the oscillating signal to generate a down-mixed signal, i.e., the second intermediate frequency signal(or "2nd IF" which is applied to bandpass filter 161. since both the first and the second intermediate frequency signals are not 0 Hz frequencies, such a receiver is called a heterodyne receiver. Bandpass filter 161 allows the frequency band given for an allocated channel of the second intermediate frequency signal to be filtered, and limiter 162 amplifies the amplitude of the filtered, second intermediate frequency signal to the amplitude suitable for demodulation. Frequency demodulator 131 generates a demodulated signal which is supplied to audio processor 133. Audio processor 133 allows an original aural signal to be outputted through a transducer such as speaker 135 by performing functions, such as, for example, audio filtering, de-emphasis, and variable gain for the demodulated signal.

Referring to only the drawing, the heterodyne receiver shown in FIG. 1 is likely to be seen as a very simple construction. However, it is to be noted that bandpass filter 161 as a channel filter is realized with a ceramic or LC filter occupying a relatively large space. Thus, since such a bandpass filter 161 is essentially not integrated by a semiconductor, it is difficult to reduce the volume of the receiver from a manufacturing standpoint. In addition, another problem with the prior art is that a heterodyne receiver employs an asynchronous system and as such, receiving sensitivity as a measurement for performance of the receiver is relatively degraded.

Meanwhile, in order to resolve these conventional problems, the Barber receiver as shown in FIG. 2 has been designed. This type of receiver, which was proposed by Barber in 1947, is seen about 1.5 times as complex as the receiver shown in FIG. 1. But, substantially, since it is possible to apply modern semiconductor integration technology to the Barber receiver, it is more attractive than the heterodyne receiver.

Referring now to FIG. 2, the procedure in which a high frequency signal having a spectrum (301,302 in FIG. 3a) of a double sided band is received by antenna 101 and the first intermediate frequency signal is generated before preamplifier 109 is similar to that the heterodyne receiver of FIG. 1. However, with respect to the subsequent procedure in which the second intermediate frequency signal is generated, the operation of the Barber receiver is very different from that of the heterodyne receiver. The first intermediate frequency signal 110 outputted from preamplifier 109 is applied to second down-mixer 111 of an I-channel and second down-mixer 119 of a Q-channel with the electric power being equally divided into halves. Such a receiver differs from the heterodyne receiver in that it complex-converts the intermediate frequency while dropping the intermediate frequency to 0 Hz, divides a channel into two mutual orthogonal vector channel(I-channel, Q-channel) to channel-filter the frequency at a baseband and demodulate the frequency. The Barber receiver is commonly referred to as a zero IF(i.e., an intermediate frequency of 0 Hz) receiver.

The output signal from second local oscillator 146 is applied to 90° phase shifter 147, which applies the output signal to second down-mixer 111 of the I-channel with a phase delay of 0° and second down-mixer 119 of Q-channel with a phase delay of 90°, respectively. At this moment, the oscillating frequency from second local oscillator 146 is equal with the frequency of the first intermediate frequency signal. Therefore, second down-mixer 111 generates a baseband signal with a phase delay of 0° on line 112, and second down-mixer 119 generates a baseband signal with a phase delay of 90° on line 120. Lines 112 and 120 are coupled to filters 113 and 121, respectively.

Immediately prior to its division, the first intermediate frequency signal on line 110 maintains a double sided band as it is. This is because only the centered frequency of the first intermediate frequency signal has been down-converted to a frequency besides 0 Hz from the centered frequency of the high frequency signal having a spectrum of a double sided band received by antenna 101. However, since second down-mixers 111 and 119 down-converts the center frequency to 0 Hz, both lower side band and upper side band of a spectrum of the first intermediate frequency signal are representative of two single side bands having band limiting properties of a distance spaced apart equally from the center frequency. The lower side band is of a negative spectrum and the upper side band of a positive spectrum (306 in FIG. 3a). As a result, the spectrum of a single side band superpositioning the lower side band and the upper side band is shown(305 in FIG. 3a), and the bandwidth of the first intermediate frequency signal is reduced to half of a spectrum bandwidth of the high frequency signal received by antenna 101. Therefore, the baseband signals generated on lines 112 and 120, (i.e., the outputs of second down-mixers 111 and 119) are applied to low pass filters 113 and 121 as channel filters which pass, with minimal attenuation, frequency components of the baseband signal up to the low pass filter cutoff frequency, and reject frequency components of the baseband signal above the low pass filter cutoff frequency. Low pass filters 113 and 121 generate filtered signals of the bandwidth of the single side band on lines 114 and 122 which are coupled to blocking capacitors 115 and 123, respectively. Blocking capacitors 115 and 123 are operative to block the DC components of the baseband level signals filtered by low pass filters 113 and 121. The AC components of the baseband level signals generated on lines 116 and 124 are applied to up-mixer 117 of an I-channel and up-mixer 125 of a Q-channel, respectively.

An oscillating signal generated by third local oscillator 139 is applied to 90° phase shifter 140 which generates an oscillating signal with a phase delay of 0° on line 142 and generates an oscillating signal with a phase delay of 90° on line 141. Mixers 117 and 125 are also supplied with oscillating signals on lines 142 and 141, respectively. The oscillating signals generated on lines 142 and 141 are of similar frequencies, but are offset in phase by ninety degrees. Mixers 117 and 125 generate up-converted signals on lines 118 and 126, respectively which have a phase difference of 90° from one another, center at frequencies of the oscillating signal from third local oscillator 139. The up-converted signals generated on lines 118 and 126 are combined to form the third intermediate frequency signal of a double sided band with a spectrum equal to the high frequency signal received by antenna 101. The third intermediate frequency signal is applied to bandpass filter 127 which generates a filtered signal on line 128 which is applied to limiter 129. The limiter 129 amplifies the amplitude of the filtered, third intermediate frequency signal to the amplitude required for demodulation, and then, applies the amplified third intermediate frequency signal by way of line 130 to demodulator 131. Demodulator 131 demodulates frequency-modulated components of the amplified third intermediate frequency signal on line 130 to a voltage increasing/decreasing signal. The demodulated signal is supplied to audio processor 133. Audio processor 133 allows an original aural signal to be outputted through a transducer such as speaker 135 by performing functions, such as, for example, audio filtering, de-emphasis, and variable gain for the demodulated signal.

As is apparent from the foregoing, the Barber receiver shown in FIG. 2 is about 1.5 times as complex as the heterodyne receiver shown in FIG. 1. The heterodyne receiver of type shown in FIG. 1, has other disadvantages. For example, since bandpass filter 161, as a channel filter, cannot be integrated to a semiconductor circuit, because it requires a relatively large amount of space. As such, it suffers from a loss of the passband and distortion of high frequency components to obtain desired suppression properties of an adjacent channel. This results in relatively poor performance of the receiver.

The Barber receiver, shown in FIG. 2, has been designed to resolve the above-mentioned problems with the heterodyne receiver shown in FIG. 1. Namely, low pass filters 113 and 121 in FIG. 2 can be easily embodied by a resistor, a capacitor and an operational amplifier, etc. without using an inductor, so that low pass filters 113 and 121 can be integrated to a semiconductor circuit. Therefore, when a Barber receiver is employed, the occupying space of a hardware is advantageously and relatively reduced in comparison with heterodyne receiver, and loss of a passband and distortion of high frequency components are relatively lessened in comparison with the same suppression properties of an adjacent channel as required in the heterodyne receiver. Notwithstanding the advantages of the Barber receiver, blocking capacitors 115 and 123 are disposed between low pass filters 113, 121 and up-mixers 117, 125, respectively in order to block DC error voltage of output from down-mixers 111 and 119 due to undesired voltage or interference, and DC voltage offset due to bias within a circuit, when the first intermediate frequency signal is generated by using the oscillating signal from second local oscillator 146 having the same frequency as that of the first intermediate frequency signal. Since blocking capacitors 115 and 123 cannot help but have a limited capacity value, they have only low frequency blocking properties. That is, if the capacity value of blocking capacitors 115 and 123 is exceedingly large, it is difficult to integrate blocking capacitors 115 and 123 into a semiconductor circuit and the seizing speed of an initial signal is also very slow.

A frequency response graph shown in FIG. 3c shows the combined frequency response 309 of the low frequency properties(308 in FIG. 3c) and the low pass restricting properties(307 in FIG. 3b).

In FIG. 2, the spectrum (311 in FIG. 3c) of a third intermediate frequency signal, which is up-converted at up-mixers 117 and 125, and then applied through lines 118 and 126 to band pass filter 127, is extended to a low side band and an upper side band from side to side, with the center frequency of a single side band spectrum (309 in FIG. 3c) of a baseband level being translated to a frequency (310 in FIG. 3c) of the oscillating signal from third local oscillator 139 at 0 Hz. The spectrum of a third intermediate frequency signal also represents a distorted shape having a middle depressed portion (312 in FIG. 3c) with increased attenuation toward the center frequency. Therefore, in a frequency-modulated system in which frequency deviation becomes large according to a low amplitude of low frequency components close to DC components at a I-channel and a Q-channel, (i.e., an original aural signal), there have been problems in that the smaller the components whose frequency deviation is small gets, the larger the attenuation the components have, thereby exceeding acceptable distortion levels due to the DC error voltage.

An approach to resolve this problem is more specifically described in U.S. Pat. No. 5,428,836 issued Jun. 27, 1995 and entitled "RADIO RECEIVER FOR FORMING A BASEBAND SIGNAL OF TIME-VARYING FREQUENCIES"(Motorola Inc.). FIG. 4 is a block diagram showing the inner construction of a receiver including the construction shown in FIG. 8 of U.S. Pat. No. 5,428,836. The receiver shown in U.S. Pat. No. 5,428,836 is characterized in that modulator 155 is disposed between first down-mixer 105 and first local oscillator 152 of the existing elements of the Barber receiver shown in FIG. 2.

Turning now to the block diagram of FIG. 4, modulator 155 receives any constant AC signal on line 154 and modulates the oscillating frequency signal (fc in FIG. 5) from first local oscillator 152 by the AC signal on line 154, and then supplies a time-varying frequency signal (503 in FIG. 5) in which the frequency is dependent upon time to first down-mixer 105. Therefore, the second intermediate frequency signal at 0 Hz cannot regularly drop in a low frequency blocking area (308 in FIG. 3c), and the third intermediate frequency signal cannot regularly drop in a middle depressed portion (312 in FIG. 3c). As a result, the aural signal restored and outputted through demodulator 131 and audio processor 133, and then, by way of speaker 135 cannot be regularly attenuated, which is a characteristic of the receiver shown in U.S. Pat. No. 5,428,836.

However, in a frequency-modulated communication system in which the ratio of a signal to noise as disclosed in U.S. Pat. No. 5,428,836 is proportional to the degree of frequency deviation, the time-varying frequency signal on line 156, modulated by the AC signal on line 154, allows the degree of frequency deviation of the first intermediate frequency signal on line 106 to be increased or decreased in a period (502 in FIG. 5) by an amplitude (501 in FIG. 5) of the modulated signal on line 156. Consequently, since the frequency of the modulated signal on line 156 is carried on the aural signal restored through speaker 135 with the volume of sound proportional to the amplitude (501 in FIG. 5), a compensation circuit for suppressing attenuation properties of a low frequency signal is indispensable to the receiver. Particularly, when the transmitter and receiver together share first local oscillator 152 or other local oscillators, a compensation circuit for suppressing attenuation of a low frequency signal should be inserted at the transmission path, or there is a restriction of having to select a modulation method which doesn't affect the transmitting path. Furthermore, in order to generate a low frequency modulation, a signal source for the low frequency modulation and a modulation circuit should be added.

SUMMARY OF THE INVENTION

It is therefore an object of the present invention to provide a radio receiver and a method for efficiently suppressing attenuation properties of a low frequency signal which may be generated in a radio communication system including a receiver, in which a received high frequency signal is converted to a 0 Hz intermediate frequency(IF) signal which in turn is demodulated through two divided channels.

It is a further object of the present invention to provide a radio receiver and a method in which only a receiver is provided with a device for suppressing attenuation properties of a low frequency signal. The transmitter is not provided with the device when the receiver and transmitter together share local oscillators.

It is still another object of the present invention to provide a radio receiver and a method which enables the elimination of a signal source for low frequency modulation and does not require a modulation circuit in the receiver for suppressing the attenuation properties of a low frequency signal which may be generated in a radio communication system wiring a receiver in which a received high frequency signal is converted to a 0 Hz intermediate frequency(IF) signal which, in turn, is demodulated through two divided channels.

According to a first embodiment of the present invention, there is provided a radio receiver in an analog frequency modulation type radio communication system including a receiver and a transmitter, the radio receiver comprising:

first means for down-converting in frequency an electrical signal representative of a modulated, high-frequency signal received by the radio receiver, the first down-converting means for mixing the modulated, high-frequency signal received by the radio receiver and a predetermined local oscillating signal, to generate an intermediate frequency signal;

means for modulating the predetermined local oscillating signal by an aural signal transmitted from the transmitter and generating a mixing signal for down-mixing the electrical signal representative of modulated, high-frequency signal, to apply the mixing signal to the first down-converting means;

second means for down-converting in frequency the intermediate frequency signal generated from the first down-converting means into a baseband signal, to generate the down-converted baseband signal; and means for converting the baseband signal generated from the second down-converting means into a demodulated signal representative of the modulated, high-frequency signal received by the radio receiver.

According to a second embodiment of the present invention, there is also provided a radio receiver in an analog frequency modulation type radio communication system including a receiver and a transmitter, the radio receiver comprising:

first local oscillating means for generating a first local oscillating frequency signal by a reference oscillating signal applied thereto, modulating the first local oscillating frequency signal by an aural signal transmitted from the transmitter, and supplying the modulated first local oscillating frequency signal to the receiver and the transmitter;

first means for down-converting in frequency an electrical signal representative of a modulated, high-frequency signal received by the radio receiver, the first down-converting means for mixing the modulated, high-frequency signal received by the radio receiver and the first local oscillating frequency signal as output from the first local oscillating means to generate a first intermediate frequency signal;

second local oscillating means for generating a second local oscillating frequency signal of an I-channel and a second local oscillating frequency signal of an Q-channel by a reference oscillating signal applied thereto;

third local oscillating means for generating a third local oscillating frequency signal of the I-channel and a third local oscillating frequency signal of the Q-channel by a reference oscillating signal applied thereto;

second down-converting means for mixing the first intermediate frequency signal and the second local oscillating frequency signal of the I-channel and the Q-channel, respectively and down-converting the mixed signals to a second intermediate frequency signal of a baseband frequency of the I-channel and a second intermediate frequency signal of a baseband frequency of the Q-channel, to generate down-converted baseband signals;

third converting means for mixing the second intermediate frequency signal of a baseband frequency of the I-channel and the baseband frequency of an Q-channel applied thereto from the second down-converting means and the third local oscillating frequency signal of the I-channel and Q-channel applied thereto from the third local oscillating means, respectively, and converting the mixed signals to a third intermediate frequency band signal of an I-channel and a third intermediate frequency band signal of an Q-channel, to generate converted signals; and demodulation means for demodulating a third intermediate frequency signal in which the third intermediate frequency band signal of the I-channel of the Q-channel are combined, and processing the modulated signal by an aural signal, to send the processed signal to the outside.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings, in which like reference symbols indicate the same or similar elements components, wherein.

DETAILED DESCRIPTION OF PREFERRED EMBODIMENTS

Figure 1:
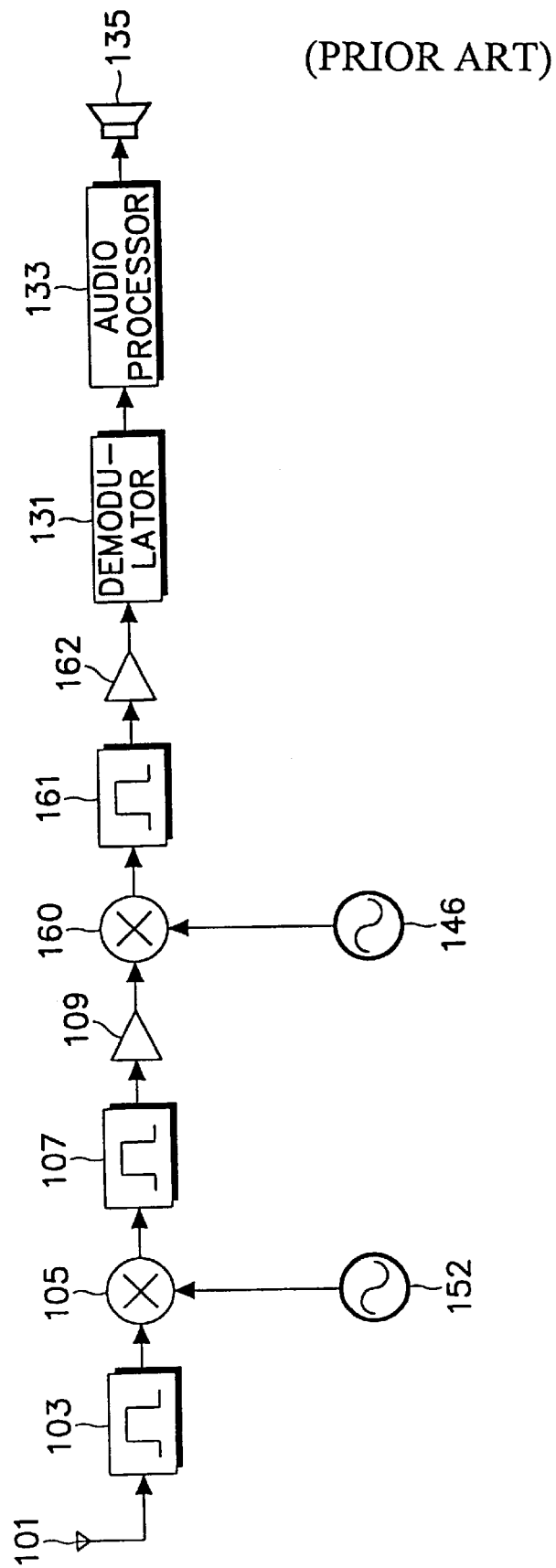
FIG. 1 is a block diagram showing the construction of a heterodyne receiver in a general analog radio communication system.
Figure 2:
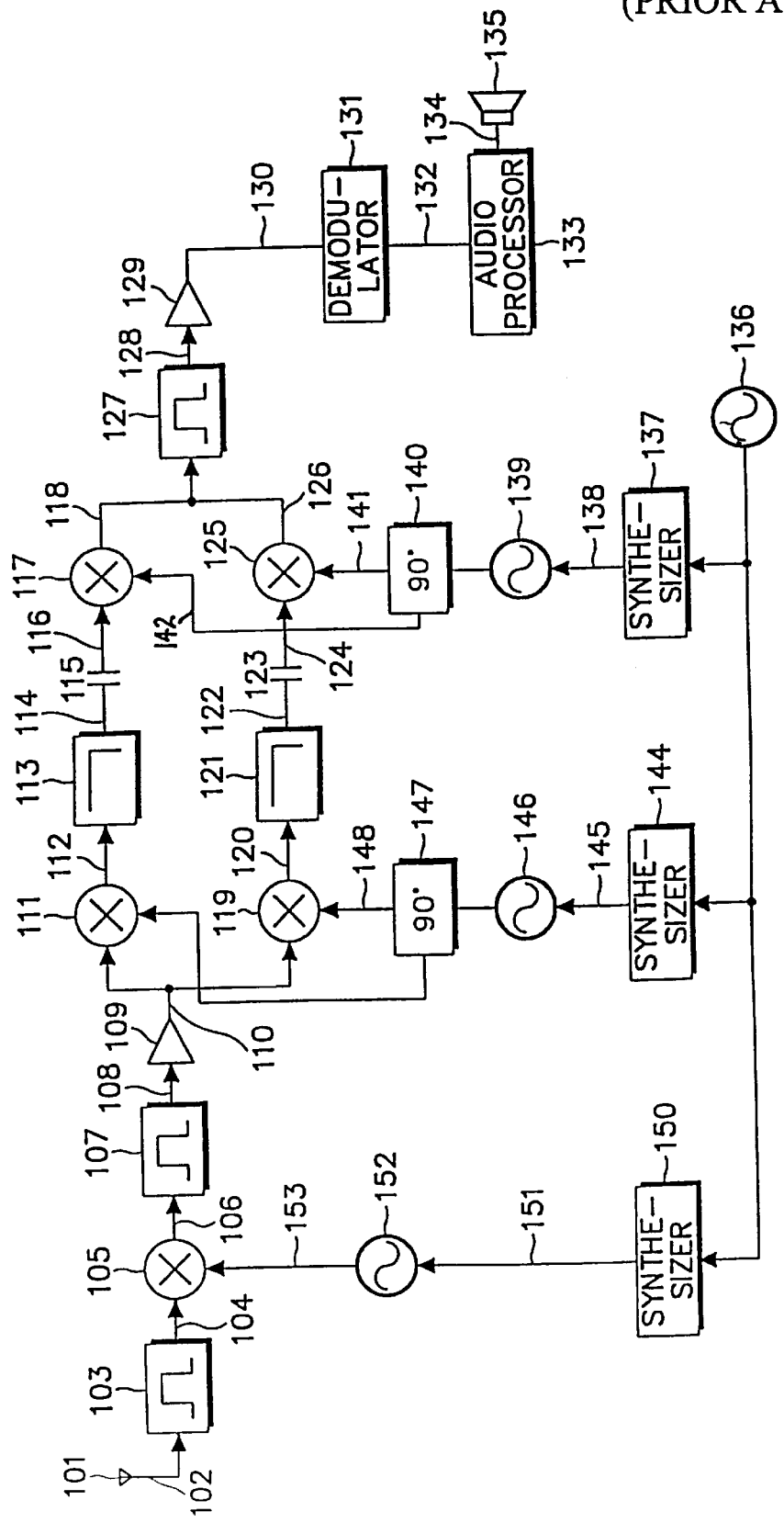
FIG. 2 is a block diagram showing the construction of a barber receiver in a general analog radio communication system.
Figure 5:
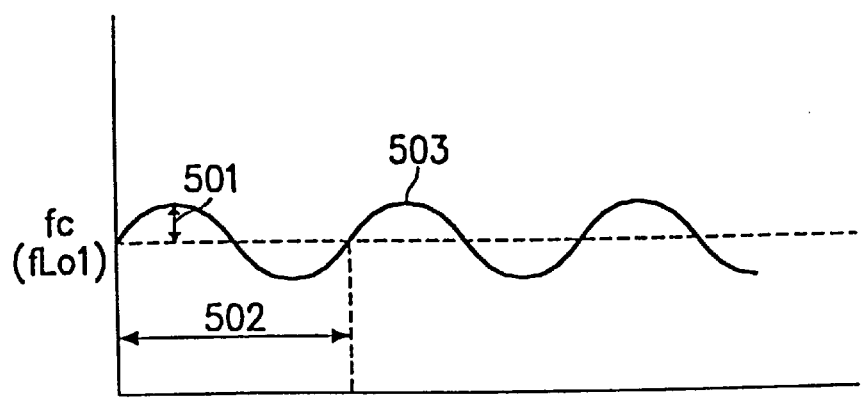
FIG. 5 is a graphical representation of the instantaneous frequency of a modulating signal generated by the modulator as shown in FIG. 4.

Now, a preferred embodiment of the present invention will be described in detail with reference to the accompanying drawings. Throughout the drawings, it is noted that the same reference numerals or letters will be used to designate like or equivalent elements having the same function. In the following description, numeral specific details such as components composing a concrete circuit, expressions are set forth to provide a more through understanding of the present invention. It will be apparent, however, to one skilled in the art that the invention may be practiced without their specific details. The detailed descriptions for known function and constructions unnecessarily obscuring the subject matter of the present invention will be avoided hereinafter. Technical terms as will be mentioned hereinbelow are terms defmed in consideration of the function in the present invention, which may be varied according to the intention of user and chip designer, so the terms should be defined based on the contents across all of this specification.

Figure 6:
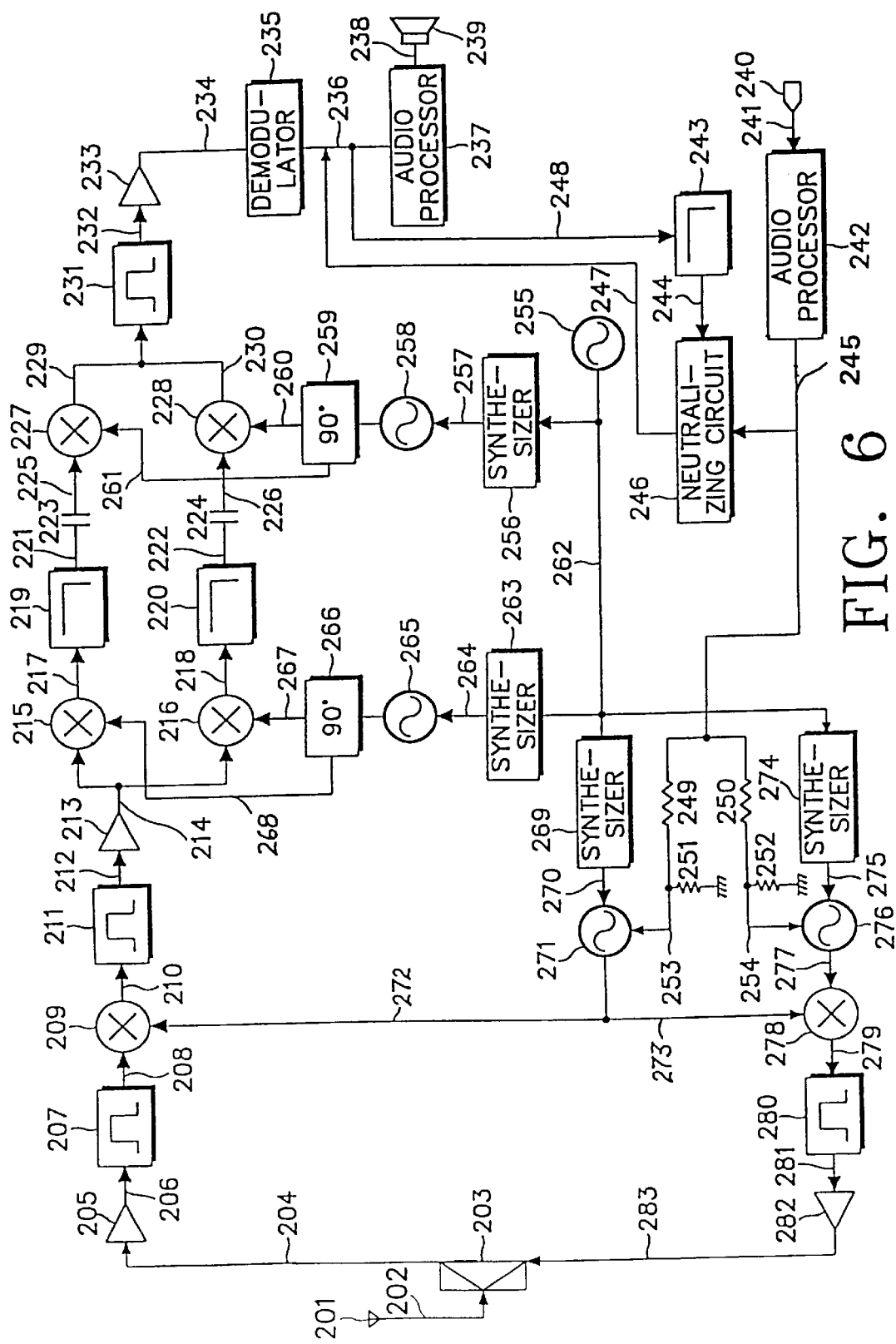
FIG. 6 is a block diagram showing the construction of an analog radio communication system in which attenuation properties of a low frequency signal are suppressed in accordance with a preferred embodiment of the present invention.

Referring to FIG. 6, there is shown a block diagram showing the construction of an analog radio communication system including a receiver, in which a received high frequency signal is converted to a 0 Hz intermediate frequency(IF) signal which in turn is demodulated through two divided channels. It is to be noted that the present invention does not additionally comprise a special signal source for low frequency modulation and a modulation circuit according to the prior art as shown and described with reference to FIG. 4, nor does it use a special compensation circuit in only the receiver when the receiver and transmitter together share first local oscillator 152 or other local oscillators without adding the compensation circuit to a transmission path, so the same effect as that of the prior art shown in FIG. 4, (i.e., attenuation suppressing properties of a low frequency signal can be obtained).

Referring now to FIG. 6, antenna 201 is coupled to duplexer 203. One terminal of duplexer 203 is coupled by way of line 204 to low noise amplifier 205 of a receiver which is operative to pass a signal received by antenna 201 at a receiving frequency band and at the same time, to block a transmitting frequency band. The other terminal of duplexer 203 is coupled by way of line 283 to power amplifier 282 of a transmitter which is operative to transmit the electric power of a transmitting signal to antenna 201, and at the same time, to block a receiving frequency band.

Meanwhile, an aural signal applied to microphone 240 in a transmitter is supplied by way of line 241 to audio processor 242 for transmission which performs functions, such as, for example, audio low pass filtering, compressing, and pre-emphasis for the aural signal to supply the processed signal on line 245 to a modulating input terminal of first local oscillator 271 comprised of resistors 249 and 251, and a modulating input terminal of second local oscillator 276 comprised of resistors 250 and 252. First local oscillating frequency synthesizer 269 and second local oscillating frequency synthesizer 274 control a frequency from first local oscillator 271 for transmission and reception, and a frequency from second local oscillator 276 for transmission in accordance with a reference oscillation signal supplied thereto by way of line 262 from reference oscillator 255. The output signals from first local oscillator 271 and second local oscillator 276 modulated by the output signal from audio processor 242 for transmission are supplied by way of lines 273 and 277 to mixer 278, respectively. Mixer 278 mixes two output signals applied thereto from first local oscillator 271 and second local oscillator 276 to generate the resultant transmission carrier frequency signal which is applied by way of line 279 to bandpass filter 280. Bandpass filter 280 is operative to filter the input signal, and apply the filtered signal by way of line 281 to power amplifier 282. Power amplifier 282 amplifies the electric power for transmission to the required amount and supplies thereby the amplified electric power by way of line 283 to duplexer 203. Consequently, Duplexer 203 supplies a transmitting signal by way of line 202 to antenna 201 which radiates the supplied transmitting signal into the air.

On the other hand, a radio-frequency, electromagnetic signal is received by antenna 201 which converts the radio-frequency, electromagnetic signal into an electric signal which is applied to duplexer 203, and then, by way of line 204, to low noise amplifier 205. Low noise amplifier 205 amplifies the received signal which is applied by way of line 206 to bandpass filter 207 which generates a filtered signal on line 208. The filtered signal is of frequencies within the passband of bandpass filter 207. The filtered signal generated on line 208 is applied to first down-mixer 209. Mixer 209 also receives an oscillating signal generated by first local oscillator 271 for transmission and reception. First down-mixer 105 mixes the filtered signal applied thereto on line 208 and the oscillating signal applied thereto on line 272 to generate a down-mixed signal, i.e., the first intermediate frequency signal(or "1st IF") which is applied to bandpass filter 211. Bandpass filter 211 generates a filtered signal which is applied by way of line 212 to amplifier 213 which amplifies the filtered signal. The first intermediate frequency signal outputted from amplifier 213 is applied by way of line 214 to second down-mixer 215 of an I-channel and second down-mixer 119 of a Q-channel with the electric power being equally divided into halves.

Second local oscillating frequency synthesizer 263 and third local oscillating frequency synthesizer 256 control a frequency from second local oscillator 265 for reception, and a frequency from third local oscillator 258, respectively, in accordance with a reference oscillation signal supplied thereto by way of line 262 from reference oscillator 255. The output signal from second local oscillator 265 is applied to 90° phase shifter 266, which divides the output signal into signals having a phase difference of 90° with respect to each other. The 0° phase shift signal is applied by way of line 268, to second down-mixer 215 of the I-channel and the 90° phase shift signal is applied by way of line 267, to second down-mixer 216 of the Q-channel. The output signal from third local oscillator 258 is applied to 90° phase shifter 259, which divides the output signal into signals having a phase difference of 90° with respect to each other. The 0° phase shift signal is applied by way of line 261, to third mixer 227 of the I-channel and the 90° phase shift signal is applied by way of line 260, to third mixer 228 of the Q-channel.

Second down-mixer 215 of the I-channel and second down-mixer 216 of the Q-channel mixes the respective halves of the first intermediate frequency signal applied thereto by way of line 214 from amplifier 213 with the respective phase shifted second local oscillating signals of 0° and 90° to generate thereby an I-channel baseband signal and a Q-channel baseband signal.

The baseband signals generated from second down-mixers 215 and 216 are applied by way of lines 217 and 218 to low pass filters 219 and 220, respectively, as channel filters which pass, with minimal attenuation, frequency components of the baseband signal up to the low pass filter cutoff frequency, and then reject frequency components of the baseband signal above the low pass filter cutoff frequency. Low pass filters 219 and 220 generate filtered signals on lines 221 and 222 which are coupled to blocking capacitors 223 and 224, respectively. Blocking capacitors 223 and 224 are operative to block the DC components of the baseband level signals filtered by low pass filters 219 and 220, but to pass the AC components of the baseband level signals filtered by low pass filters 219 and 220. The AC components of the baseband level signals generated on lines 225 and 226 are applied to third mixer 227 of the I-channel and third mixer 228 of the Q-channel, respectively.

Third mixers 227 and 228 mix the AC components of the baseband level signals of the I-channel and the Q-channel, and the phase shifted third local oscillating signals of 0° and 90° output from phase shifter 259, respectively to generate a third intermediate frequency signal of the I-channel and a third intermediate frequency signal of the Q-channel by way of lines 229 and 230, respectively. The third intermediate frequency signals on lines 229 and 230 are combined and applied to bandpass filter 231 which generates a filtered signal on line 232 which is applied to limiter 233. The limiter 233 amplifies the amplitude of the filtered, third intermediate frequency signal to the amplitude required for demodulation, and then, applies the amplified third intermediate frequency signal by way of line 234, to demodulator 235. Demodulator 235 demodulates frequency-modulated components of the amplified third intermediate frequency signal on line 234 to a voltage increasing/decreasing signal.

At this moment, the output signal from audio processor 242 for transmission is applied by way of line 245 to phase inverted neutralization circuit 246, and the output signal from phase inverted neutralization circuit 246 is combined with the output signal from demodulator 235. The combined signals are simultaneously applied to audio processor 237 and low pass filter 243. Low pass filter 243 eliminates the AC components from the combined signals and feeds-back only the DC components, which act as a reference voltage of phase inverted neutralization circuit 246. The combined signals of the output signal from phase inverted neutralization circuit 246, and the output signal from demodulator 235 are applied, by way of line 236, to audio processor 237 which allows an original aural signal to be outputted through a transducer such as speaker 239 by performing functions, such as, for example, audio low pass filtering, de-emphasis, and the expanding for the demodulated signal.

Figure 3A:
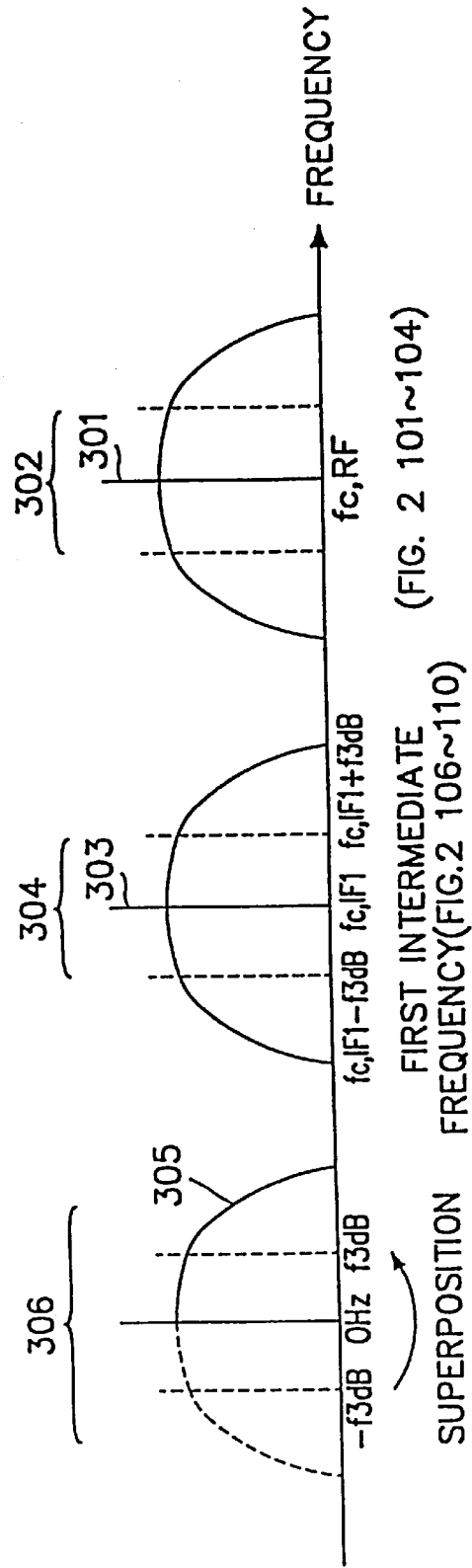
FIGS. 3a to 3c are graphical representations of the signal receiving properties of the barber receiver as shown in FIG. 2.
Figure 3B:
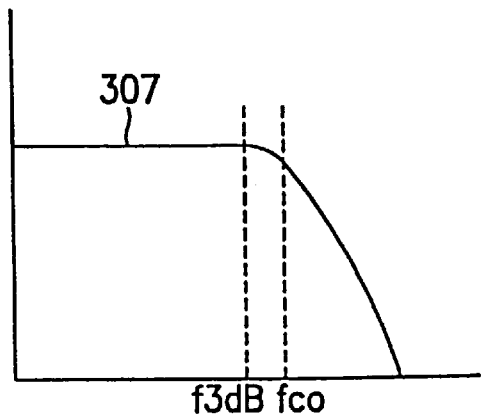
Figure 3C:
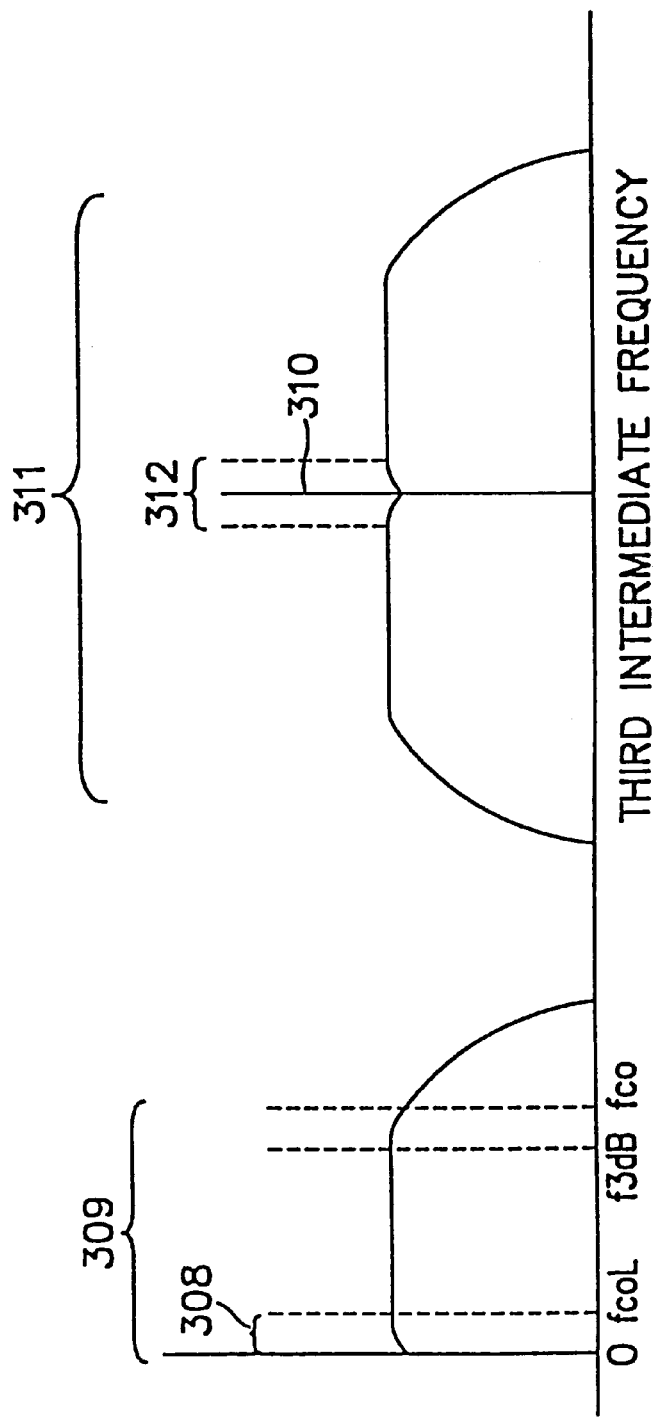

One of the features of the present invention constructed as described above is that the receiver shares first local oscillating signal generated from first local oscillator 271 of the transmitter which is modulated by the output signal from audio processor 242 for transmission, with the first local oscillating signal being modulated to a transmitting signal. Another feature of the present invention is that the output signal from demodulator 235 of the receiver is interspersed with the aural signal to be transmitted and the aural signal to be received, and the transmitting aural signal components from the interspersed signals can be removed by using phase inverted neutralization circuit 244 which receives the output signal from audio processor 242 for transmission. Since first local oscillator 271 is always in a modulated state when speaking by telephone, the low frequency components of a second intermediate frequency signal are prevented from being attenuated at a low frequency blocking region shown in FIG. 3c.

Figure 4:
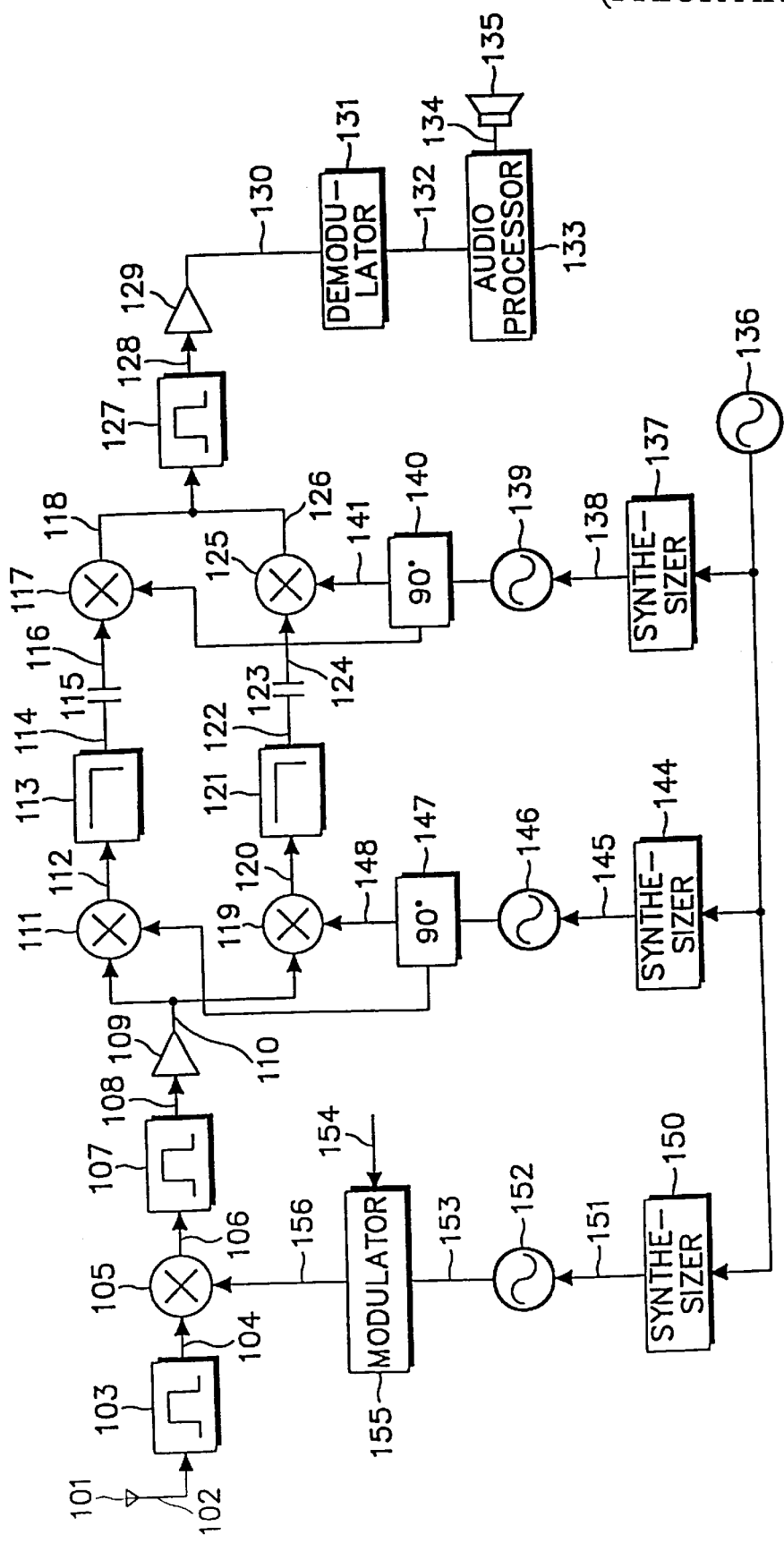
FIG. 4 is a block diagram showing the construction of an analog radio communication system in which attenuation properties of a low frequency signal are suppressed in accordance with the prior art.

Therefore, the receiver according to the embodiment of the present invention as shown in FIG. 6, can obtain attenuation suppressing effects of a low frequency signal, without requiring the addition of special modulated components by constituting a special modulating circuit like the conventional receiver shown in FIG. 4.

These characteristics of the present invention will be described hereinbelow with reference to FIG. 6.

During transmission, the output signal from aural processor 242, for transmission as a modulating signal, is applied through resistors 249, 251 and resistors 250, 252 to first local oscillator 271 for transmission and reception, and second local oscillator 276 for transmission. Since the resultant transmission carrier frequency signal generated from mixer 278 is formed by sum or difference components of two output signals, (i.e., the output signal from first local oscillator 271 and the output signal from second local oscillator 276), the modulated signal is also sum or difference components of two output signals. At this time, if the value of resistors 249 and 251 is properly set to distribute voltage, first local oscillator 271 performs the modulating operation with a degree of modulation sufficient not to attenuate low frequency components of the second intermediate frequency signal at a low frequency blocking region. In addition, if the value of resistors 250 and 252 is properly set to distribute voltage, second local oscillator 276 performs the modulating operation with a degree of modulation defined at the resultant transmission carrier frequency signal.

Accordingly, the oscillating frequency of first local oscillator 271 and the received carrier frequency are mixed and converted by first down-mixer 209 which generates the first intermediate frequency signal which has a spectrum whose received spectrum is modulated by a degree of modulation of first local oscillator 271. As a result, since second intermediate frequency signals of the I-channel and Q-channel on line 221 and 222, respectively, also have a spectrum modulated by the same degree of modulation, the low frequency components of the second intermediate frequency signal is prevented from being attenuated at a low frequency blocking region by blocking capacitors 223 and 224. The second intermediate frequency spectrums of the I-channel and Q-channel passing through blocking capacitors 223 and 224, are converted into the third intermediate frequency having a real axis spectrum at a complex plane spectrum by third mixers 227 and 228, respectively, which two output signals of 90° phase shift from third local oscillator 258 are applied. At this time, the spectrum of the third intermediate frequency is also in a state in which modulated signal components for transmission is included in an original received signal, and the third intermediate frequency signal is applied to bandpass filter 231, limiter 233, and then, by way of line 234, to demodulator 235 which generates a demodulated signal on line 236 which is supplied to audio processor 237.

Figure 7:
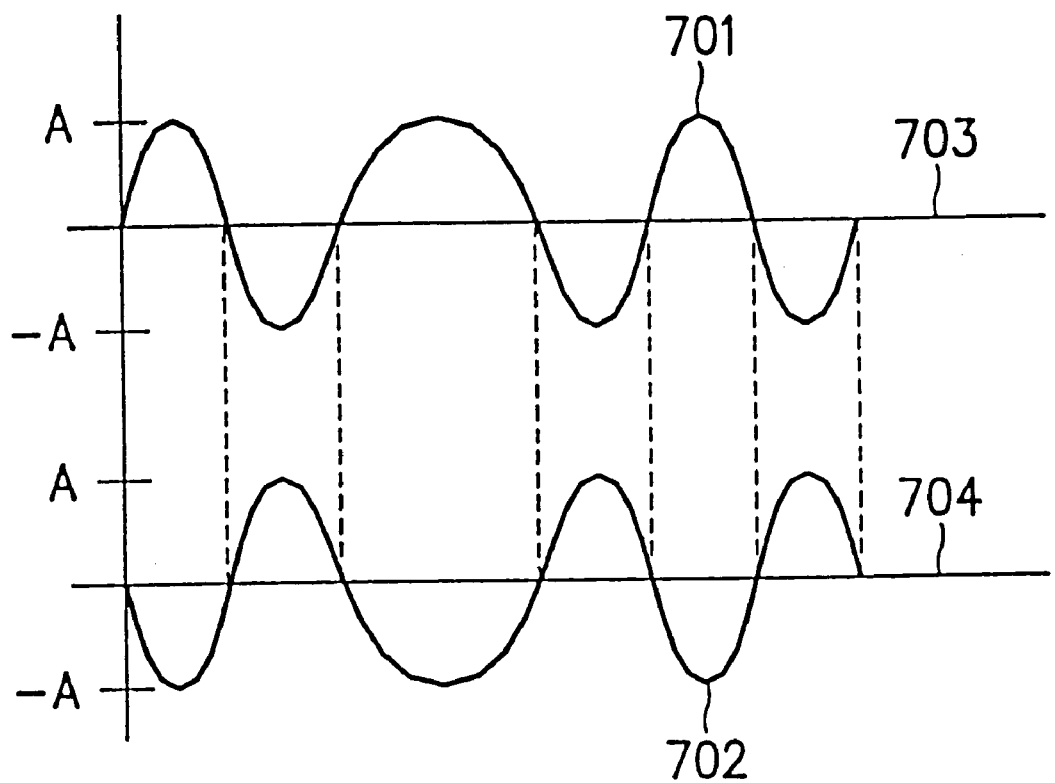
FIG. 7 is a graphical representation of an aural signal for transmission mixed with a received signal and outputted by the demodulator in the radio receiver and a phase inverting signal applied to offset the aural signal.

Since the demodulated signal from demodulator 235 is interspersed with a signal of such type as the output signal from audio processor 242 for transmission, there is need to remove the signal of such type. At this moment, output signal components of audio processor 242, with which output signal from demodulator 235 is interspersed, is equal with the type of an original output signal from audio processor 242, but differs from the original output signal in amplitude. Also, the output signal components of audio processor 242 experience a phase delay while passing through line 272, line 210 and line 236. Therefore, in consideration of this variation in amplitude and phase delay, they should be offset. Consequently, an output signal from audio processor 242 is applied to phase inverted neutralization circuit 246 which inverts the phase of the output signal, and increases or decrease the amplitude of the output signal so that the amplitude can be equal to the signal components (701 in FIG. 7) with which the output signal from demodulator 235 is interspersed, and then generates the resultant signal (702 in FIG. 7) delayed by the phase difference delayed at the above receiving path to offset and remove the signal components (701 in FIG. 7). The output signal from demodulator 235 is applied to low pass filter 243 which smooths the output signal by average DC voltage and applies the smoothed signal as reference voltage by way of line 244 to phase inverted neutralization circuit 246. Namely, low pass filter 243 is operative to remove an error between the DC components (703 in FIG. 7) of output signal from demodulator 235 and the DC components (704 in FIG. 7) of the output signal from phase inverted neutralization circuit 246.

As described above, a radio communication system according to the present invention has the following advantages compared to a radio communication system disclosed in U.S. Pat. No. 5,428,836.

Firstly, the conventional radio communication system of FIG. 4 uses a special modulating signal source for modulating the output signal from the first local oscillator in order to improve low frequency attenuation properties at a second intermediate frequency by inserting DC blocking capacitor 115 between low pass filter 113 and up-mixer 117. But a radio communication system according to the present invention does not require a special modulating signal source since it uses an existing aural signal for transmission.

Secondly, since there is no need to construct a special modulating signal source, undesired interference is not generated.

Thirdly, in the conventional radio communication system of FIG. 4, since a special modulating signal source, which is a new signal source, serves as pure noise at an aural signal outputted from a speaker for a receiver, the pure noise should be eliminated. Also, a compensation circuit for offsetting and removing it should be designed very precisely. However, in a radio communication system according to the present invention, since a transmission aural signal is used, any signal remaining at the output signal of a speaker for a receiver is heard like a sidetone which should be originally made intentionally in a telephone, so a compensation circuit for offsetting and removing it need not be designed so precisely like the type of a radio communication system in FIG. 4, only enough compensation to use it as a sidetone may be made. Such a circuit is not nearly as difficult to construct.

Fourthly, since the radio communication system of the present invention employs a transmitting modulation method by first local oscillator for transmission and reception without using a special modulating signal source to improve low frequency attenuation properties, there is no need to form a special compensation circuit at the transmitting path, thus restriction for the modulation method is relatively small.

While there have been illustrated and described what are considered to be preferred embodiments of the present invention, it will be understood by those skilled in the art that various changes and modifications and equivalents may be substituted for elements thereof without departing from the true scope of the present invention. Therefore, it is intended that the present invention not be limited to the particular embodiments disclosed as the best mode contemplated for carrying out the present invention, but that the present invention embrace all alternatives, modifications and variances falling within the scope of the appended claims.

What is claimed is:

1. A radio receiver in an analog frequency modulation type radio communication system including a receiver and a transmitter, said radio receiver comprising:

first means for down-converting in frequency an electrical signal representative of a modulated, high-frequency signal received by the radio receiver, said first down-converting means for mixing the modulated, high-frequency signal received by the radio receiver and a predetermined local oscillating signal, to generate an intermediate frequency signal;

means for modulating said predetermined local oscillating signal by an aural signal transmitted from the transmitter and generating a mixing signal for down-mixing the electrical signal representative of the modulated, high-frequency signal, to apply the mixing signal to said first down-converting means;

second means for down-converting in frequency the intermediate frequency signal generated from said first down-converting means into a baseband signal, to generate a down-converted baseband signal; and means for converting the down-converted baseband signal into a demodulated signal representative of the modulated, high-frequency signal received by the radio receiver.

2. A radio receiver in an analog frequency modulation type radio communication System including a receiver and a transmitter, said radio receiver comprising:

first local oscillating means for generating a first local oscillating frequency signal, modulating the first local oscillating frequency signal by an aural signal transmitted from the transmitter, and supplying the modulated first local oscillating frequency signal to the receiver and the transmitter;

first means for down-converting in frequency an electrical signal representative of a modulated, high-frequency signal received by the radio receiver, said first down-converting means for mixing the modulated, high-frequency signal received by the radio receiver and the modulated first local oscillating frequency signal to generate a first intermediate frequency signal;

second local oscillating means for generating a second local oscillating frequency signal of an I-channel and a second local oscillating frequency signal of Q-channel;

third local oscillating means for generating a third local oscillating frequency signal of the I-channel and a third local oscillating frequency signal of the Q-channel;

second down-converting means for mixing the intermediate frequency signal and the second local oscillating frequency signal of an I-channel and the Q-channels, respectively, and down-converting the mixed signals to a second intermediate frequency signal of the baseband frequency of an I-channel and a second intermediate frequency signal of a baseband frequency of an Q-channel, to generate down-converted baseband signals;

third converting means for mixing the down-converted baseband signals of the I-channel and the Q-channel and the third local oscillating frequency signals of the I-channel and the Q-channel, respectively, and converting the mixed signals to a third intermediate frequency band signal of the I-channel and a third intermediate frequency band signal of the Q-channel, to generate converted signals; and demodulation means for demodulating a third intermediate frequency signal in which the third intermediate frequency band signals of the I-channel the Q-channel are combined, and processing the modulated signal by an aural signal, to output the processed signal through a transducer to the outside.

3. The receiver according to claim 2 wherein said demodulation means further comprises:

a demodulator for demodulating the third intermediate frequency signal;

an audio processor for processing an output signal from the demodulator by a predetermined aural signal, and sending the processed signal through a speaker to the outside; and means for eliminating an aural signal transmitted from the transmitter from components of an aural signal processed by said audio processor.

4. The receiver according to claim 3 wherein said means for eliminating generates a signal having an amplitude equal to the aural signal transmitted from the transmitter and an inverted phase.

5. In a radio receiver in an analog frequency modulation type radio communication system including a receiver and a transmitter, the radio receiver comprising a first down-converting means for mixing a modulated, high-frequency signal received by the radio receiver and a predetermined local oscillating signal to generate an intermediate frequency signal, a second means for down-converting, in frequency, the intermediate frequency signal generated from the first down-converting means into a baseband signal to generate a down-converted baseband signal, and a demodulator for demodulating the down-converted baseband signal into a demodulated signal representative of the modulated, high-frequency signal received by the radio receiver, a method for suppressing attenuation properties of a low frequency signal of signal components demodulated by said demodulator, said method comprising the steps of:

modulating said predetermined local oscillating signal by an aural signal transmitted from the transmitter; and applying the modulated local oscillating signal to said first down-converting means.

* * * * *